United States Patent
Barlow et al.

(10) Patent No.: US 7,523,346 B2
(45) Date of Patent: Apr. 21, 2009

(54) SYSTEMS AND METHODS FOR CPU REPAIR

(75) Inventors: Jeff Barlow, Roseville, CA (US); Jeff Brauch, Fort Collins, CO (US); Howard Calkin, Roseville, CA (US); Raymond Gratias, Fort Collins, CO (US); Stephen Hack, Fort Collins, CO (US); Lacey Joyal, Fort Collins, CO (US); Guy Kuntz, Richardson, TX (US); Ken Pomaranski, Roseville, CA (US); Michael Sedmak, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 509 days.

(21) Appl. No.: 11/356,560

(22) Filed: Feb. 17, 2006

(65) Prior Publication Data

US 2008/0005616 A1 Jan. 3, 2008

Related U.S. Application Data

(60) Provisional application No. 60/654,258, filed on Feb. 18, 2005.

(51) Int. Cl.
G06F 11/00 (2006.01)

(52) U.S. Cl. .................................. 714/7; 714/8; 714/42

(58) Field of Classification Search ...................... 714/7, 714/8, 42, 710, 711
See application file for complete search history.

(56) References Cited

U.S. PATENT DOCUMENTS

| | | | |
|---|---|---|---|
| 4,684,885 A | 8/1987 | Chapman et al. | |
| 5,649,090 A * | 7/1997 | Edwards et al. | 714/10 |
| 5,954,435 A * | 9/1999 | Yoshida | 714/42 |
| 5,961,653 A | 10/1999 | Kalter et al. | |
| 6,006,311 A | 12/1999 | Arimilli et al. | |
| 6,181,614 B1 | 1/2001 | Aipperspach et al. | |
| 6,363,506 B1 | 3/2002 | Karri et al. | |
| 6,425,094 B1 | 7/2002 | Drogichen et al. | |
| 6,516,429 B1 * | 2/2003 | Bossen et al. | 714/47 |
| 6,651,182 B1 * | 11/2003 | Chang et al. | 714/3 |
| 6,654,707 B2 | 11/2003 | Wynn et al. | |
| 6,708,294 B1 * | 3/2004 | Nakao et al. | 714/42 |
| 6,789,048 B2 * | 9/2004 | Arndt et al. | 702/186 |
| 6,832,329 B2 * | 12/2004 | Ahrens et al. | 714/5 |
| 6,851,071 B2 * | 2/2005 | Bossen et al. | 714/5 |
| 6,922,798 B2 * | 7/2005 | Nemani et al. | 714/710 |
| 6,954,851 B2 | 10/2005 | Natu | |
| 6,973,604 B2 * | 12/2005 | Davis et al. | 714/710 |
| 6,985,826 B2 | 1/2006 | Pomaranski et al. | |
| 7,007,210 B2 * | 2/2006 | Fields et al. | 714/718 |
| 7,047,466 B2 | 5/2006 | Meaney et al. | |
| 7,058,782 B2 * | 6/2006 | Henderson et al. | 711/170 |
| 7,117,388 B2 | 10/2006 | Arimilli et al. | |
| 7,134,057 B1 * | 11/2006 | Kaushik et al. | 714/711 |
| 7,155,637 B2 | 12/2006 | Jarboe et al. | |
| 7,155,645 B1 | 12/2006 | Korhonen | |
| 7,321,986 B2 | 1/2008 | Ash et al. | |
| 7,350,119 B1 * | 3/2008 | Zuraski et al. | 714/711 |
| 7,409,600 B2 | 8/2008 | Azevedo et al. | |

(Continued)

Primary Examiner—Marc Duncan

(57) ABSTRACT

Systems and methods for repairing a processor are provided. In one embodiment, a method for repairing a processor is provided that includes, for example, the steps of initializing and executing an operating system, determining that a cache element is faulty, and swapping in a spare cache element for said faulty cache element while the operating system is executing.

49 Claims, 12 Drawing Sheets

U.S. PATENT DOCUMENTS

| | | |
|---|---|---|
| 7,418,367 B2 | 8/2008 | Pomaranski et al. |
| 2003/0074598 A1* | 4/2003 | Bossen et al. ............... 714/6 |
| 2003/0212884 A1 | 11/2003 | Lee et al. |
| 2004/0133826 A1* | 7/2004 | Zhu et al. ............... 714/711 |
| 2004/0143776 A1 | 7/2004 | Cox |
| 2004/0221193 A1 | 11/2004 | Armstrong et al. |
| 2005/0096875 A1 | 5/2005 | Pomaranski et al. |
| 2006/0248394 A1 | 11/2006 | McGowan |

* cited by examiner

SYSTEMS AND METHODS FOR CPU REPAIR

CROSS-REFERENCE TO RELATED APPLICATIONS

This application claims priority from U.S. Provisional application Ser. No. 60/654,258 filed on Feb. 18, 2005.

This application is also related to the following U.S. patent applications:

"Systems and Methods for CPU Repair", Ser. No. 60/654,741, filed Feb. 18, 2005, Ser. No. 11/356,756, filed Feb. 17, 2006, having the same title;

"Systems and Methods for CPU Repair", Ser. No. 60/654,259, filed Feb. 18, 2005, Ser. No. 11/356,559, filed Feb. 17, 2006, having the same title;

"Systems and Methods for CPU Repair", Ser. No. 60/654,255, filed Feb. 18, 2005, Ser. No. 11/356,564, filed Feb. 17, 2006, having the same title;

"Systems and Methods for CPU Repair", Ser. No. 60/654,272, filed Feb. 18, 2005, Ser. No. 11/357,384, filed Feb. 17, 2006 having the same title;

"Systems and Methods for CPU Repair", Ser. No. 60/654,256, filed Feb. 18, 2005, Ser. No. 11/356,576, filed Feb. 17, 2006, having the same title;

"Systems and Methods for CPU Repair", Ser. No. 60/654,740, filed Feb. 18, 2005, Ser. No. 11,356,521, filed Feb. 17, 2006, having the same title;

"Systems and Methods for CPU Repair", Ser. No. 60/654,739, filed Feb. 18, 2005, Ser. No. 11/357,396, filed Feb. 17, 2006, having the same title;

"Systems and Methods for CPU Repair", Ser. No. 60/654,744, filed Feb. 18, 2005, Ser. No. 11/356,548, filed Feb. 17, 2006, having the same title;

"Systems and Methods for CPU Repair", Ser. No. 60/654,743, filed Feb. 18, 2005, Ser. No. 11/357,386, filed Feb. 17, 2006, having the same title;

"Methods and Systems for Conducting Processor Health-Checks", Ser. No. 60/654,203, filed Feb. 18, 2005, Ser. No. 11/357,385, filed Feb. 17, 2006, having the same title; and "Methods and Systems for Conducting Processor Health-Checks", Ser. No. 60,654,273, filed Feb. 18, 2005, Ser. No. 11/356,759, filed Feb. 17, 2006, having the same title;

which are incorporated herein by reference.

BACKGROUND

At the heart of many computer systems is the microprocessor or central processing unit (CPU) (referred to collectively as the "processor.") The processor performs most of the actions responsible for application programs to function. The execution capabilities of the system are closely tied to the CPU: the faster the CPU can execute program instructions, the faster the system as a whole will execute.

Early processors executed instructions from relatively slow system memory, taking several clock cycles to execute a single instruction. They would read an instruction from memory, decode the instruction, perform the required activity, and write the result back to memory, all of which would take one or more clock cycles to accomplish.

As applications demanded more power from processors, internal and external cache memories were added to processors. A cache memory (hereinafter cache) is a section of very fast memory located within the processor or located external to the processor and closely coupled to the processor. Blocks of instructions or data are copied from the relatively slower system memory (DRAM) to the faster cache memory where they can be quickly accessed by the processor.

Cache memories can develop persistent errors over time, which degrade the operability and functionality of their associated CPU's. In such cases, physical removal and replacement of the failed or failing cache memory has been performed. Moreover, where the failing or failed cache memory is internal to the CPU, physical removal and replacement of the entire CPU module or chip has been performed. This removal process is generally performed by field personnel and results in greater system downtime. Thus, replacing a CPU is inconvenient, time consuming and costly.

SUMMARY

In one embodiment, a method for repairing a processor is provided. The method includes, for example, the steps of initializing and executing an operating system, determining that a cache element is faulty, and swapping in a spare cache element for said faulty cache element while the operating system is executing.

DETAILED DESCRIPTION

The following includes definition of exemplary terms used throughout the disclosure. Both singular and plural forms of all terms fall within each meaning:

"Logic", as used herein includes, but is not limited to, hardware, firmware, software and/or combinations of each to perform a function(s) or an action(s). For example, based on a desired application or needs, logic may include a software controlled microprocessor, discrete logic such as an application specific integrated circuit (ASIC), or other programmed logic device. Logic may also be fully embodied as software.

"Cache", as used herein includes, but is not limited to, a buffer or a memory or section of a buffer or memory located within a processor ("CPU") or located external to the processor and closely coupled to the processor.

"Cache element", as used herein includes, but is not limited to, one or more sections or sub-units of a cache.

"CPU", as used herein includes, but is not limited to, any device, structure or circuit that processes digital information including for example, data and instructions and other information. This term is also synonymous with processor and/or controller.

"Cache management logic", as used herein includes, but is not limited to, any logic that can store, retrieve, and/or process data for exercising executive, administrative, and/or supervisory direction or control of caches or cache elements.

"During", as used herein includes, but is not limited to, in or throughout the time or existence of; at some point in the entire time of; and/or in the course of.

Figure 1:
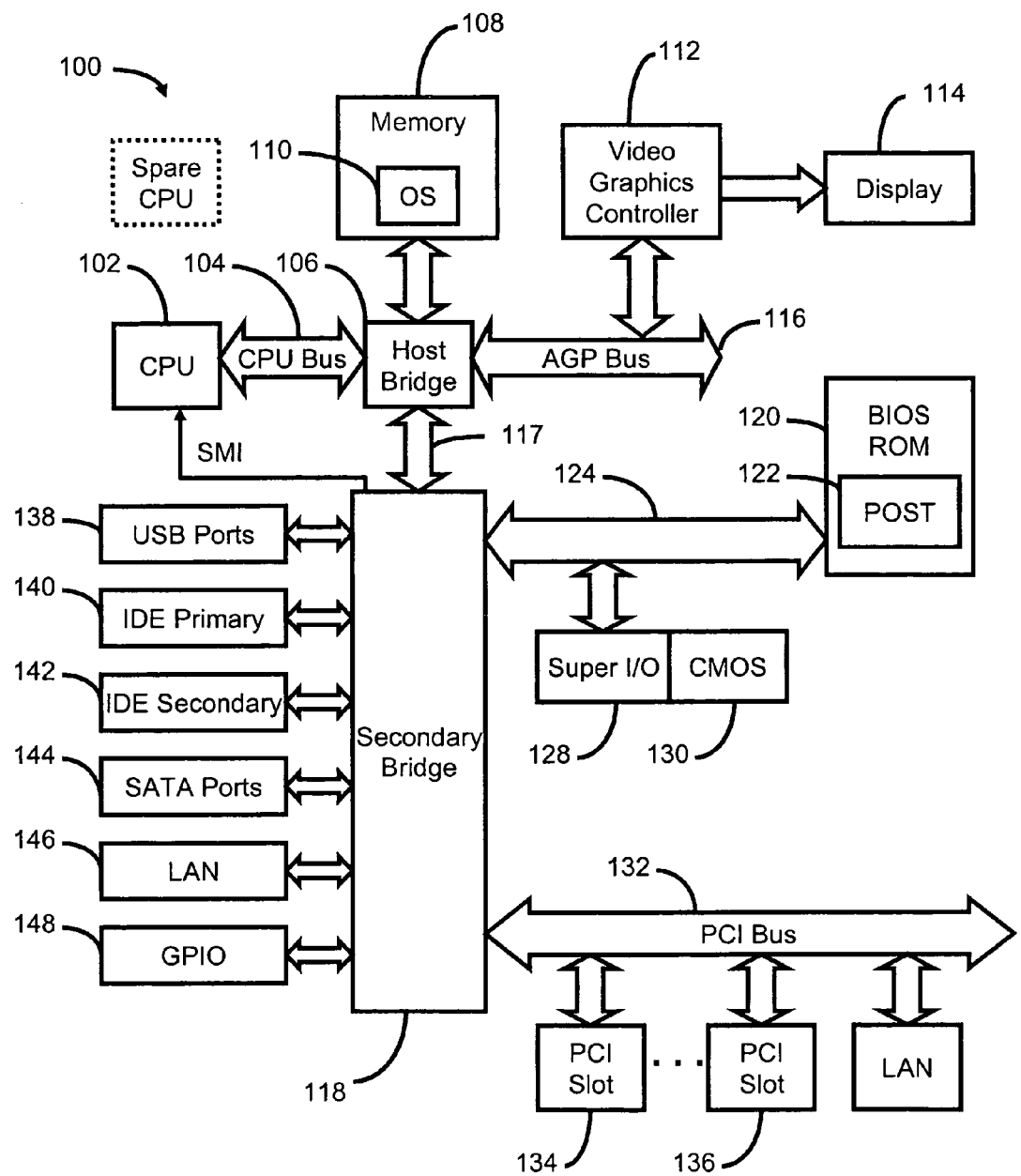
FIG. 1 is an exemplary overall system diagram.

Referring now to FIG. 1, a computer system 100 constructed in accordance with one embodiment generally includes a central processing unit ("CPU") 102 coupled to a host bridge logic device 106 over a CPU bus 104. CPU 102 may include any processor suitable for a computer such as, for example, a Pentium or Centrino class processor provided by Intel. A system memory 108, which may be is one or more synchronous dynamic random access memory ("SDRAM") devices (or other suitable type of memory device), couples to host bridge 106 via a memory bus. Further, a graphics controller 112, which provides video and graphics signals to a display 114, couples to host bridge 106 by way of a suitable graphics bus, such as the Advanced Graphics Port ("AGP") bus 116. Host bridge 106 also couples to a secondary bridge 118 via bus 117.

A display 114 may be a Cathode Ray Tube, liquid crystal display or any other similar visual output device. An input device is also provided and serves as a user interface to the system. As will be described in more detail, input device may be a light sensitive panel for receiving commands from a user such as, for example, navigation of a cursor control input system. Input device interfaces with the computer system's I/O such as, for example, USB port 138. Alternatively, input device can interface with other I/O ports.

Secondary Bridge 118 is an I/O controller chipset. The secondary bridge 118 interfaces a variety of I/O or peripheral devices to CPU 102 and memory 108 via the host bridge 106. The host bridge 106 permits the CPU 102 to read data from or write data to system memory 108. Further, through host bridge 106, the CPU 102 can communicate with I/O devices on connected to the secondary bridge 118 and, and similarly, I/O devices can read data from and write data to system memory 108 via the secondary bridge 118 and host bridge 106. The host bridge 106 may have memory controller and arbiter logic (not specifically shown) to provide controlled and efficient access to system memory 108 by the various devices in computer system 100 such as CPU 102 and the various I/O devices. A suitable host bridge is, for example, a Memory Controller Hub such as the Intel® 875P Chipset described in the Intel® 82875P (MCH) Datasheet, which is hereby fully incorporated by reference.

Referring still to FIG. 1, secondary bridge logic device 118 may be an Intel® 82801EB I/O Controller Hub 5 (ICH5)/ Intel® 82801ER I/O Controller Hub 5 R (ICH5R) device provided by Intel and described in the Intel® 82801EB ICH5/ 82801ER ICH5R Datasheet, which is incorporated herein by reference in its entirety. The secondary bridge includes various controller logic for interfacing devices connected to Universal Ser. Bus (USB) ports 138, Integrated Drive Electronics (IDE) primary and secondary channels (also known as parallel ATA channels or sub-system) 140 and 142, Ser. ATA ports or sub-systems 144, Local Area Network (LAN) connections, and general purpose I/O (GPIO) ports 148. Secondary bridge 118 also includes a bus 124 for interfacing with BIOS ROM 120, super I/O 128, and CMOS memory 130. Secondary bridge 118 further has a Peripheral Component Interconnect (PCI) bus 132 for interfacing with various devices connected to PCI slots or ports 134-136. The primary IDE channel 140 can be used, for example, to couple to a master hard drive device and a slave floppy disk device (e.g., mass storage devices) to the computer system 100. Alternatively or in combination, SATA ports 144 can be used to couple such mass storage devices or additional mass storage devices to the computer system 100.

The BIOS ROM 120 includes firmware that is executed by the CPU 102 and which provides low level functions, such as access to the mass storage devices connected to secondary bridge 118. The BIOS firmware also contains the instructions executed by CPU 102 to conduct System Management Interrupt (SMI) handling and Power-On-Self-Test ("POST") 122. POST 102 is a subset of instructions contained with the BIOS ROM 102. During the boot up process, CPU 102 copies the BIOS to system memory 108 to permit faster access.

The super I/O device 128 provides various inputs and output functions. For example, the super I/O device 128 may include a serial port and a parallel port (both not shown) for connecting peripheral devices that communicate over a serial line or a parallel pathway. Super I/O device 108 may also include a memory portion 130 in which various parameters can be stored and retrieved. These parameters may be system and user specified configuration information for the computer system such as, for example, a user-defined computer set-up or the identity of bay devices. The memory portion 130 in National Semiconductor's 97338VJG is a complementary metal oxide semiconductor ("CMOS") memory portion. Memory portion 130, however, can be located elsewhere in the system.

Figure 2:
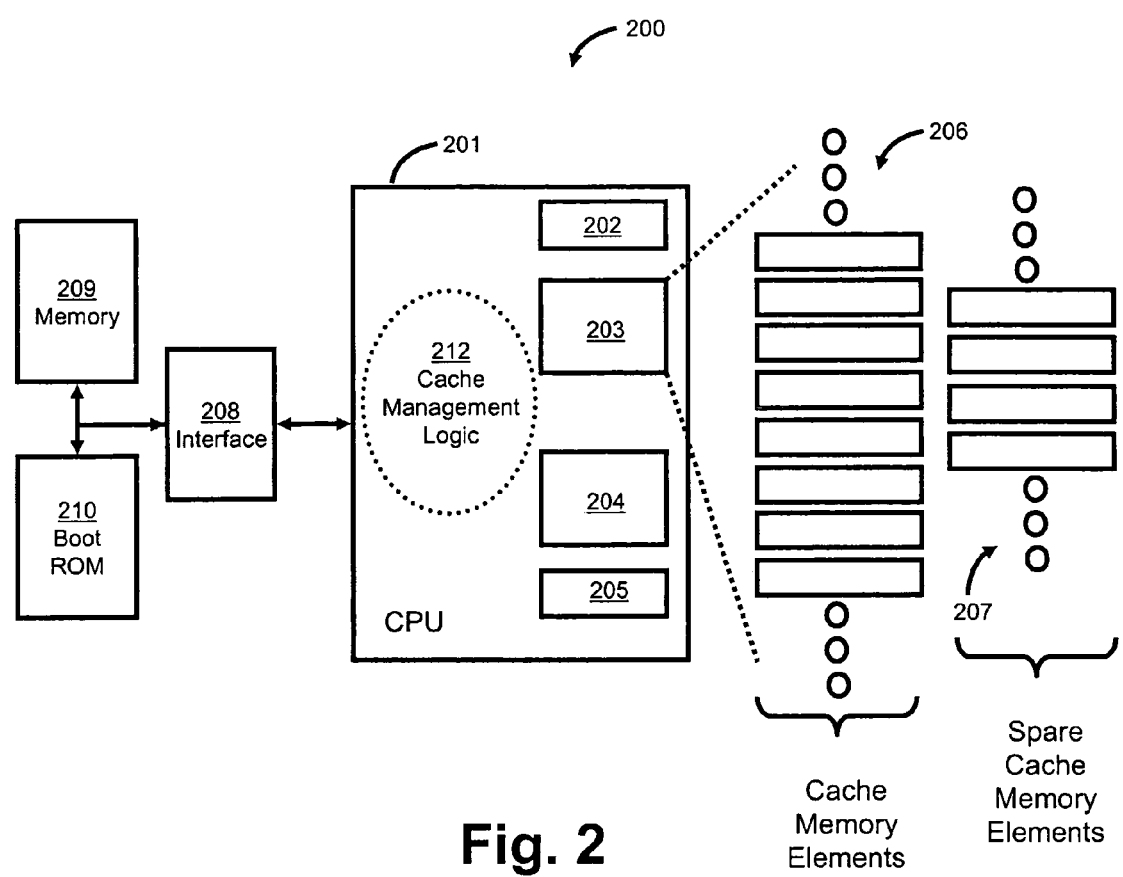
FIG. 2 is an exemplary diagram of a CPU cache management system.

Referring to FIG. 2, one embodiment of the CPU cache management system 200 is shown. CPU cache management system 200 includes a CPU chip 201 having various types of cache areas 202, 203, 204, 205. Although only one CPU chip is shown in FIG. 2, more than one CPU chip may be used in the computer system 100. The types of cache area may include, but is not limited to, D-cache elements, I-cache elements, D-cache element tags, and I-cache element tags. The specific types of cache elements are not critical.

Within each cache area 202, 203, 204, 205 are at least two subsets of elements. For example, FIG. 2 shows the two subsets of cache elements for cache area 203. The first subset includes data cache elements 206 that are initially being used to store data. The second subset includes spare cache elements 207 that are identical to the data cache elements 206, but which are not initially in use. When the CPU cache areas are constructed, a wafer test is applied to determine which cache elements are faulty. This is done by applying multiple voltage extremes to each cache element to determine which cache elements are operating correctly. If too many cache elements are deemed faulty, the CPU is not installed in the computer system 100. At the end of the wafer test, but before the CPU is installed in the computer system 100, the final cache configuration is laser fused in the CPU chip 201. Thus, when the computer system 100 is first used, the CPU chip 201 has permanent knowledge of which cache elements are faulty and is configured in such a way that the faulty cache elements are not used.

As such, the CPU chip 201 begins with a number of data cache elements 206 that have passed the wafer test and are currently used by the CPU chip. In other words, the data cache elements 206 that passed the water test are initially presumed to be operating properly and are thus initially used or allocated by the CPU. Similarly, the CPU chip begins with a number of spare or non-allocated cache elements 207 that have passed the wafer test and are initially not used, but are available to be swapped in for data cache elements 206 that become faulty.

Also included in the CPU cache management system 200 is logic 212. In the exemplary embodiment of FIG. 2, the logic 212 is contained in the CPU core logic. However, logic 212 may be located, stored or run in other locations. Furthermore, the logic 212 and its functionality may be divided up into different programs, firmware or software and stored in different locations.

Connected to the CPU chip 201 is an interface 208. The interface 208 allows the CPU chip 201 to communication with and share information with a non-volatile memory 209 and a boot ROM. The boot ROM contains data and information needed to start the computer system 100 and the non-volatile memory 209 may contain any type of information or data that is needed to run programs or applications on the computer system 100, such as, for example, the cache element configuration.

Figure 3:
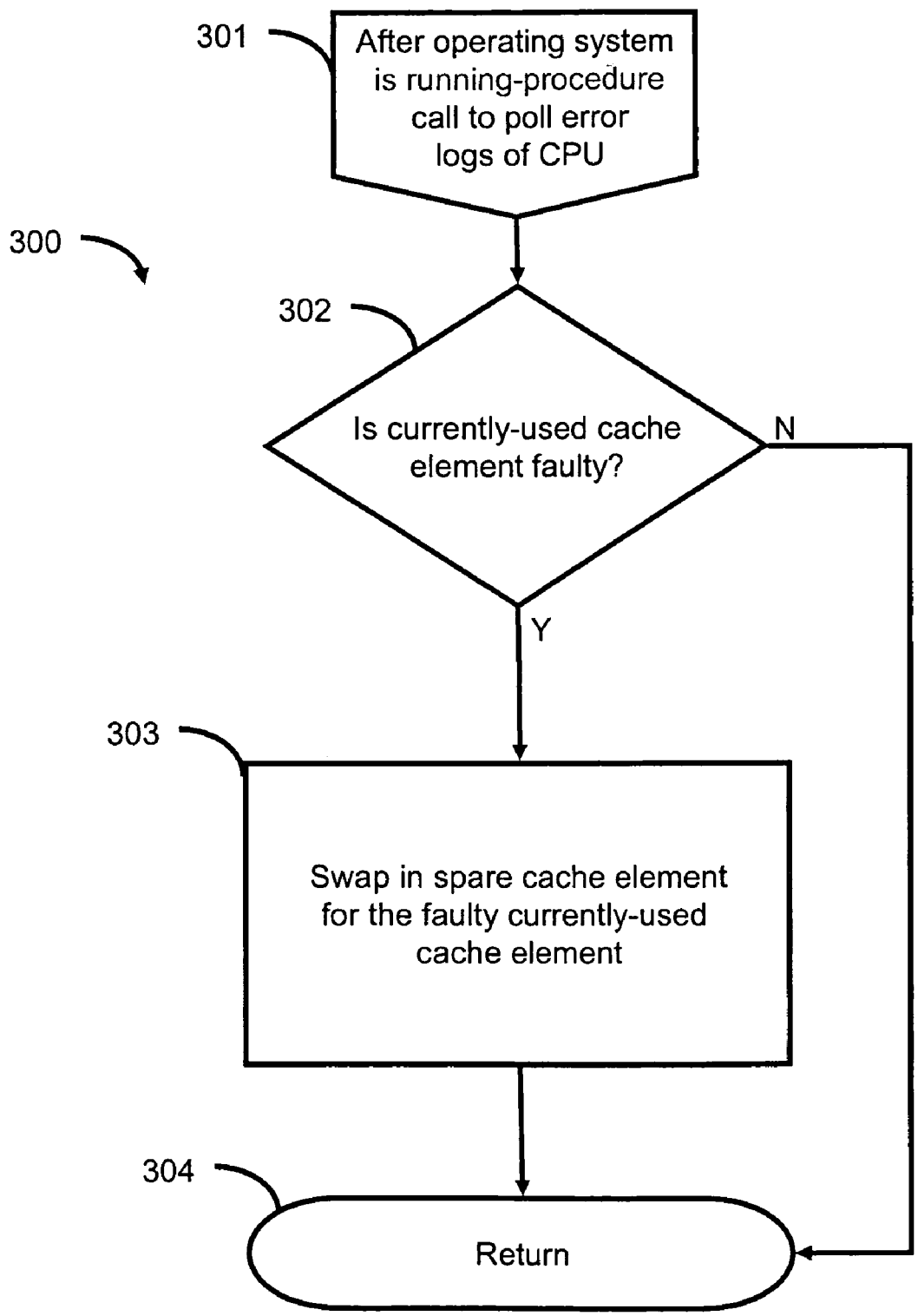
FIG. 3 is a high level flow chart of cache management logic.

Now referring to FIG. 3, a high level flow chart 300 of an exemplary process of the cache management logic 212 is shown. The rectangular elements denote "processing blocks" and represent computer software instructions or groups of instructions. The diamond shaped elements denote "decision blocks" and represent computer software instructions or groups of instructions which affect the execution of the computer software instructions represented by the processing blocks. Alternatively, the processing and decision blocks represent steps performed by functionally equivalent circuits such as a digital signal processor circuit or an application-specific integrated circuit (ASIC). The flow diagram does not depict syntax of any particular programming language. Rather, the flow diagram illustrates the functional information one skilled in the art may use to fabricate circuits or to generate computer software to perform the processing of the system. It should be noted that many routine program elements, such as initialization of loops and variables and the use of temporary variables are not shown.

The cache management logic refers generally to the monitoring, managing, handling, storing, evaluating and/or repairing of cache elements and/or their corresponding cache element errors. Cache management logic can be divided up into different programs, routines, applications, software, firmware, circuitry and algorithms such that different parts of the cache management logic can be stored and run from various different locations within the computer system 100. In other words, the implementation of the cache management logic can vary.

The cache management logic 300 begins after the operating system of the computer system 100 is up and running. During boot-up of the computer system 100, the CPU 201 may have a built-in self-test (BIST), independent of the cache management logic, in which the cache elements are tested to make sure that they are operating correctly. However, the testing and repair must come during the booting process. This results in greater downtime and less flexibility since the computer system 100 must be rebooted in order to determine if cache elements are working properly. However, as shown in FIG. 3, the cache management logic may be run while the operating system is up and running. While the operating system is running, any internal cache error detected by hardware is stored in the CPU logging registers and corrected with no interruption to the processor. A diagnostics program, for example, periodically polls each CPU for errors in the logging registers through a diagnostic procedure call. The diagnostic program may then determine whether a cache element is faulty based on the error information in the logging registers of each CPU and may repair faulty cache elements if necessary without rebooting the system. As a result, the computer system 100 may monitor and locate faulty cache elements continuously, and repair faulty cache elements without having to reboot the computer system each time a cache element is determined to be faulty. Thus, the computer system 100 knows of faulty cache elements sooner and can repair the faulty cache elements without having the reboot the system or run with known faulty cache elements.

While the operating system is running, the cache management logic 212 determines whether any of the currently-used or allocated cache elements 206 within the CPU are faulty (step 301). This is accomplished, for example, by totaling the number of errors that each cache element accumulates and corrects using a standard error-correction code (ECC) within the CPU over a period of time and comparing that totaled number against a predetermined threshold value or number. If a currently-used cache element is not faulty (step 302), the cache management logic simply returns to normal operation (step 304). However, if a currently-used cache element is determined to be faulty (step 302), a spare or non-allocated cache element 207 is swapped in for the faulty currently-used cache element (step 303). The swapping process takes place at regularly scheduled intervals, for example, the cache management logic may poll a CPU every fifteen minutes. If a cache element is determined to be faulty, the cache management logic may repair the faulty cache element immediately (i.e. during the procedure poll call) or may schedule a repair at some later time (i.e. during an operating system interrupt).

Figure 4:
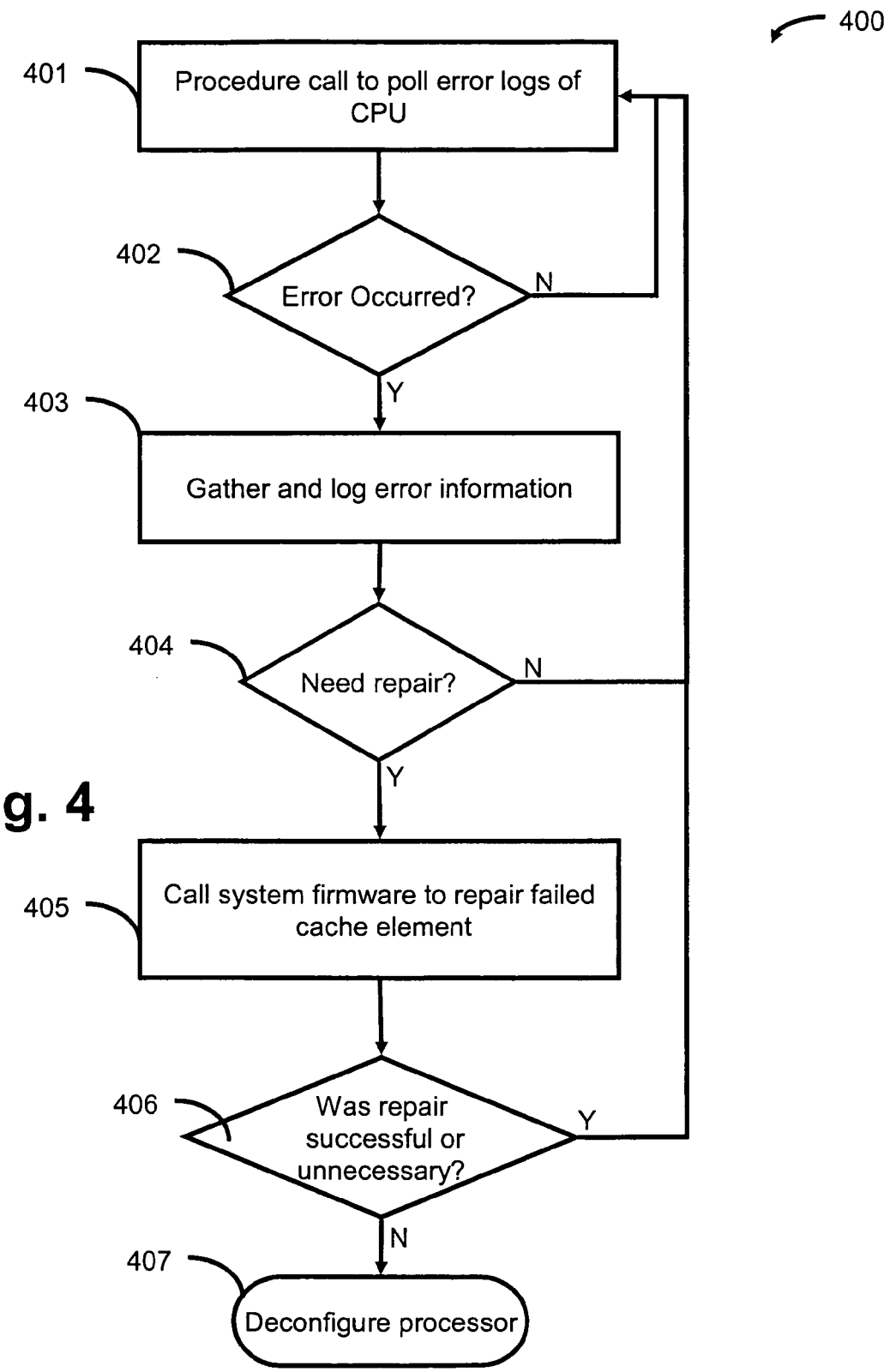
FIG. 4 is a flow chart of cache management logic.

Now referring to FIG. 4, an exemplary process of the cache management logic is shown in the form of a flow chart 400. In the embodiment shown in FIG. 4, the cache management logic begins after the operating system of the computer system 100 is up and running. The cache management logic periodically schedules polling calls to poll the error logs within each CPU. In step 401, the currently used cache elements 206 are polled for cache errors through, for example, a procedure poll call or a hardware interrupt. Polling refers to the process by which cache elements are interrogated for purposes of operational functionality. This can be accomplished by, for example, having a diagnostic program or application monitor the error logs corresponding to each cache elements on a consecutive basis. At step 402, the cache management logic decides whether the particular cache element has produced an error. One method of determining if the cache element has produced an error is by, for example, using or implementing an error-correction code (ECC) routine within the CPU and monitoring how many times error-correction was used on the cache memory element or elements. If an error has not occurred, the cache management logic returns to step 401 and continues polling for cache errors. However, if a cache error has occurred, the cache management logic proceeds to step 403 where it gathers and logs the error information.

The error information that is gathered and logged includes, but is not limited to, the time of the error, which cache element the error occurred, and the type of error. Similarly, the manner in which the error information is logged may vary. For example, the error information may be logged in the non-volatile memory 209 or other memory location.

After the error information has been gathered and logged, the cache management logic determines in step 404 whether the particular cache element that produced the error needs to be repaired. The determination of whether a particular cache element needs to be repaired may vary. For example, in one embodiment a cache element may be deemed in need of repair if its error production exceeds a predetermined threshold number of errors. The threshold number of errors measured may also be correlated to a predetermined time period. In other words, a cache element may be deemed in need of repair if its error production exceeds a predetermined threshold value over a predetermined time period. For example, a cache element may be deemed in need of repair if its error production exceeds 20 errors over the past 24 hour period. As stated above, the precise method of determining if a cache element is in need of repair may vary and is not limited to the examples discussed above.

If the cache management logic determines that the particular cache element does not need to be repaired, the cache management logic returns to step 401 and continues polling for cache errors. However, if the cache element is in need of repair (i.e. the cache element is faulty), the cache management logic advances to step 405 and calls or requests for system firmware, which may be part of the cache management logic, to repair the faulty cache element. The details of the repair process will be explained in greater detail with reference to FIG. 5. While the repair process requested in FIG. 4 is to the firmware, the repair process is not limited to being performed by the firmware, and may be performed by any subpart of the cache management logic.

Once the repair request has been made, the cache management logic determines, at step 406, whether the repair was successful and/or not needed. This can be accomplished by, for example, using the repair process shown in FIG. 5 and discussed later below. If the attempted repair was successful, the cache management logic returns to step 401 and continues polling for cache errors. However, if the attempted repair was not successful, the cache management logic de-configures and de-allocates the CPU chip 201 at step 407 so that it may no longer by used by the computer system 100. Alternatively, the cache management logic may, if a spare CPU chip is available, swap in the spare CPU chip for the de-allocated CPU chip. The "swapping in" process refers generally to the reconfiguration and re-allocation within the computer system 100 and its memory 108 such that the computer system 100 recognizes and utilizes the spare (or swapped in) device in place of the faulty (or de-allocated) device, and no longer utilizes the faulty (or de-allocated) device. The "swapping in" process may be accomplished, for example, by using associative addressing. More specifically, each spare cache element has an associative addressing register and a valid bit associated with it. To repair a faulty cache element, the address of the faulty cache element is entered into the associative address register on one of the spare cache elements, and the valid bit is turned on. The hardware may then automatically access the replaced element rather than the original cache element.

Figure 5:
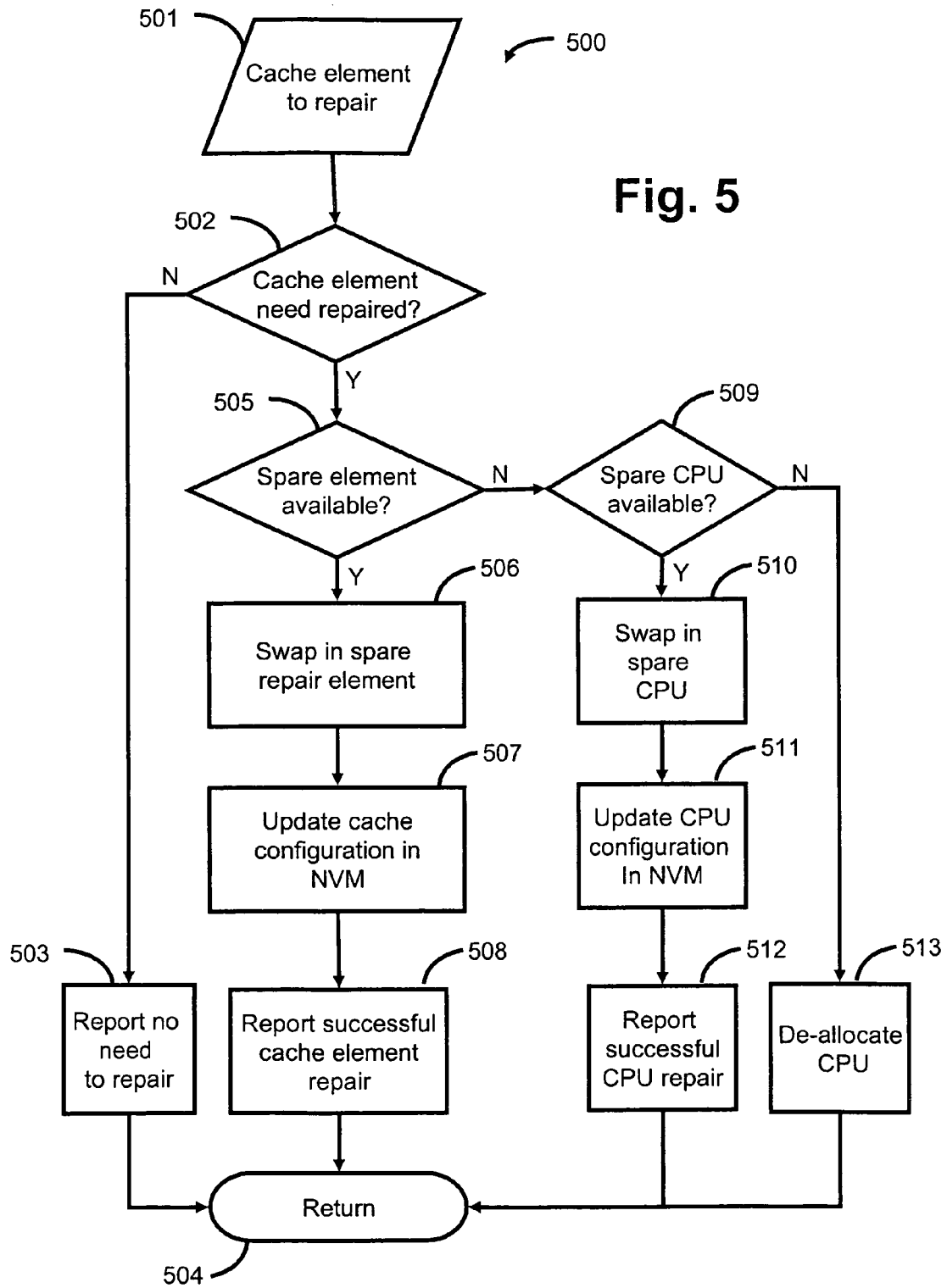
FIG. 5 is a flow chart of a repair process of the cache management logic.

Referring to FIG. 5, one embodiment of a repair process 500 of the cache management logic is illustrated. The repair process 500 begins by gathering the cache element error information related to the cache element that is to be repaired at step 501. Having the necessary cache element error information, the cache management logic again determines at step 502 whether the particular cache element needs to be repaired. While this may appear to be redundant of step 404, the determination step 502 may be more thorough than determining step 404. For example, the determining step 404 may be a very preliminary determination performed by the operating system 110 of the computer system 100 based solely on the number of errors that have occurred on the particular cache element. The determining step 502 may be a detailed analysis performed by a specific firmware diagnostics program which may consider more parameters other than the number of errors, such as, for example, the types of errors and the time period over which the various errors have occurred. In alternative embodiments, step 502 may be omitted.

If the cache element does not need to be replaced based on the determination at step 502, the cache management logic reports that there is no need to repair that cache element at step 503 and the cache management logic at step 504 returns to step 406. However, if the repair process 500 determines that the cache element needs to be repaired, the cache management logic then determines at step 505 whether a spare cache element is available. In making this determination, the cache management logic may utilize any spare cache element 207 that is available. In other words, there is no predetermined or pre-allocated spare cache element 207 for a particular cache element 206. Any available spare cache element 207 may be swapped in for any cache element 206 that becomes faulty. Although in another embodiment, there may be a set of spare cache elements associated with each particular cache element. The cache management logic would only use the spare elements from the associated set.

If a spare cache element 207 is available, the cache management logic, at step 506 swaps in the spare cache element 207 for the faulty cache element. A spare cache element may be swapped in for a previously swapped in spare cache element that has become faulty. Hereinafter, such swapping refers to any process by which the spare cache element is mapped for having data stored therein or read therefrom in place of the faulty cache element. In one embodiment, this can be accomplished by de-allocating the faulty cache element and allocating the spare cache element in its place. To maintain coherent operation, the data in the cache element about to be repaired must be copied back (flushed) to a memory prior to being de-allocated. This will prevent loss of any modified data. Additionally, the spare cache element should not have any data patterns that indicate to the CPU that random data is valid. To save repair time, the spare cache elements may be cleared at boot time, and may also be cleared during repair.

Once the spare cache element has been swapped in for the faulty cache element, the cache configuration is updated in the non-volatile memory 209 at step 507. Once updated, the cache management logic reports that the cache element repair was successful at step 508 and returns at step 504 to step 406.

If, however, it is determined at step 505 that a spare cache element is not available, then the cache management logic determines at step 509 whether a spare CPU is available. If desired, the cache management logic may omit the CPU determination at step 509 and simply de-allocate the present CPU if there are no spare cache elements. If a spare CPU is available, the cache management logic at step 510 swaps in the spare CPU for the faulty CPU. This is accomplished by de-allocating the faulty CPU and reconfiguring the computer system 100 to recognize and utilize the spare CPU in place of the faulty CPU. A spare CPU may be swapped in for a previously swapped in spare CPU that has become faulty. Once the spare CPU has been swapped in for the faulty CPU, the new CPU cache configuration is then utilized in the non-volatile memory 209 at step 511. Once updated, the cache management logic reports that the CPU repair was successful at step 512 and returns at step 504 to step 406.

Finally, if it is determined at step 509 that a spare CPU is not available, then the cache management logic de-allocates the faulty CPU at step 513 and reports that condition at step 504. Accordingly, the cache configuration and CPU configuration will change and be updated as different cache elements and CPU chips become faulty and are swapped out for spare cache elements and spare CPU chips. Furthermore, all of the repairing occurs while the operating system of the computer system 100 is up and running without having to reboot the computer system 100.

Figure 6:
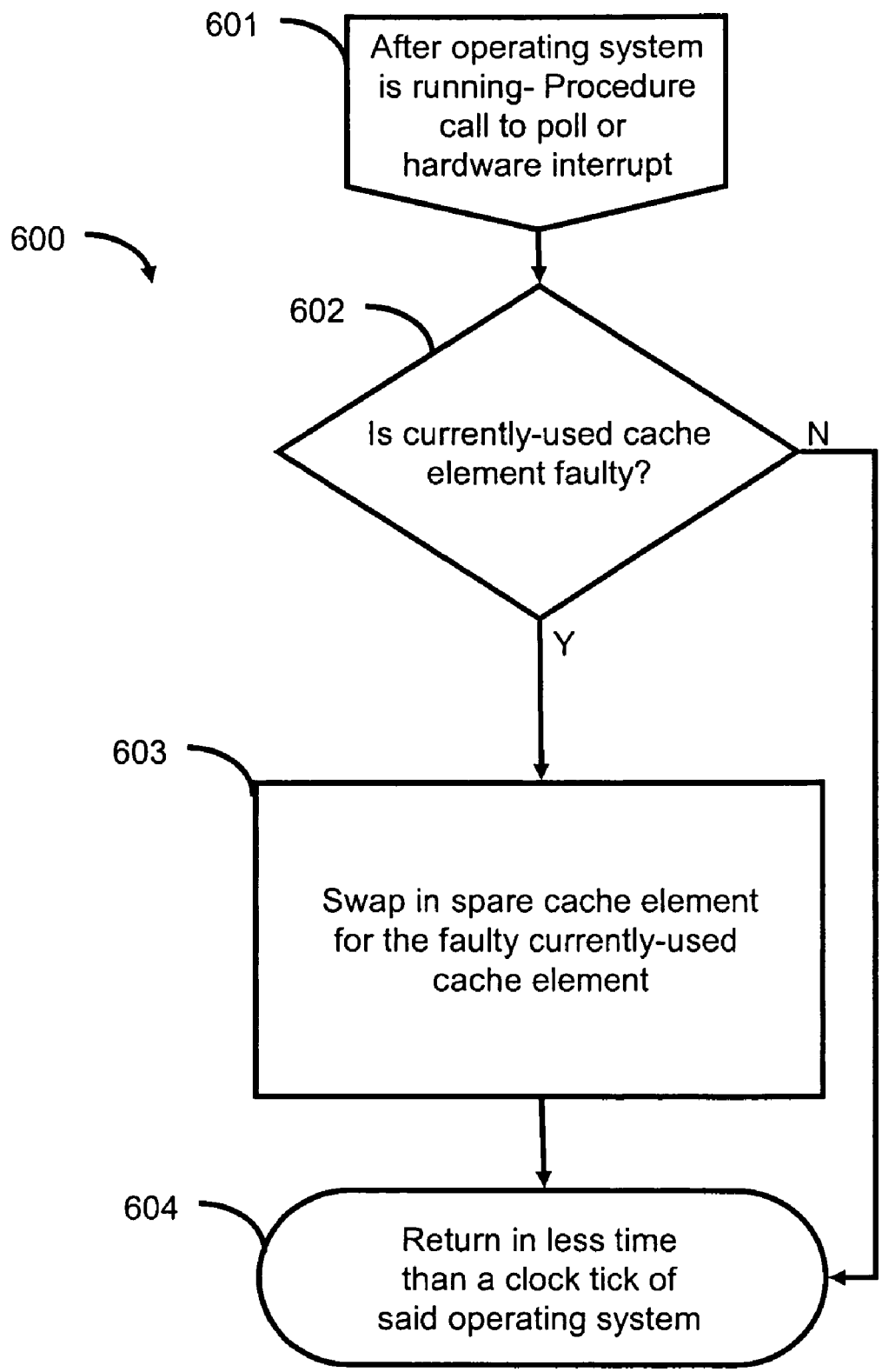
FIG. 6 is a high level flow chart of cache management logic.

Sometimes it becomes desirable to repair a faulty cache element without the operating system's knowledge. By repairing a faulty cache element without the operating system's knowledge, no applications running on the operating system are interrupted, and therefore, such a procedure can be run on any operating system. However, to accomplish this, the cache management logic must be able to repair the faulty cache element within a clock tick of the operating system. In other words, the repair subroutine must take less time than a clock tick of the operating system. For example, a clock tick may be approximately 10 ms, and in this example, the repair subroutine must take in less than 10 ms. FIG. 6 shows a high level method for repairing faulty cache elements without the operating system being interrupted.

Referring to FIG. 6, one embodiment of a flow chart 600 illustrating faulty cache element repair without the operating system's knowledge is shown. More specifically, while the operating system is running the cache management logic periodically schedules a poll/repair call (or following a hardware interrupt) (step 601). During this call, which takes less than one clock tick of the operating system, the cache management logic will check the CPU's error logs, decide if a cache element is faulty based on the error information in the logs and the cache element error history, and repair a faulty cache element.

Following a poll call, the cache management logic determines whether any of the currently-used cache elements within the CPU are faulty (step 602). This can be accomplished by any of the previously described methods. If a currently-used cache element is not faulty (step 602), the cache management logic simply returns to normal operation (step 604). However, if a currently-used cache element is determined to be faulty (step 602), a spare cache element is swapped in for the faulty currently-used cache element (step 603). The entire process is performed in less time than a clock tick of the operating system. As a result, the operating system is uninterrupted and the method can be implemented on any system regardless of the type of operating system used.

While the disclosed embodiment describes the faulty cache repair as occurring within one clock tick, the repair can also occur during or within two or more clock ticks. If the repair process takes more than one clock tick, there may be the possibility of an operating system fault because the CPU may miss a clock checkpoint. As a result, optional safeguards may be employed to ensure that CPU clock checkpoints are not missed or are appropriately handled if missed to not cause system faults.

Figure 7:
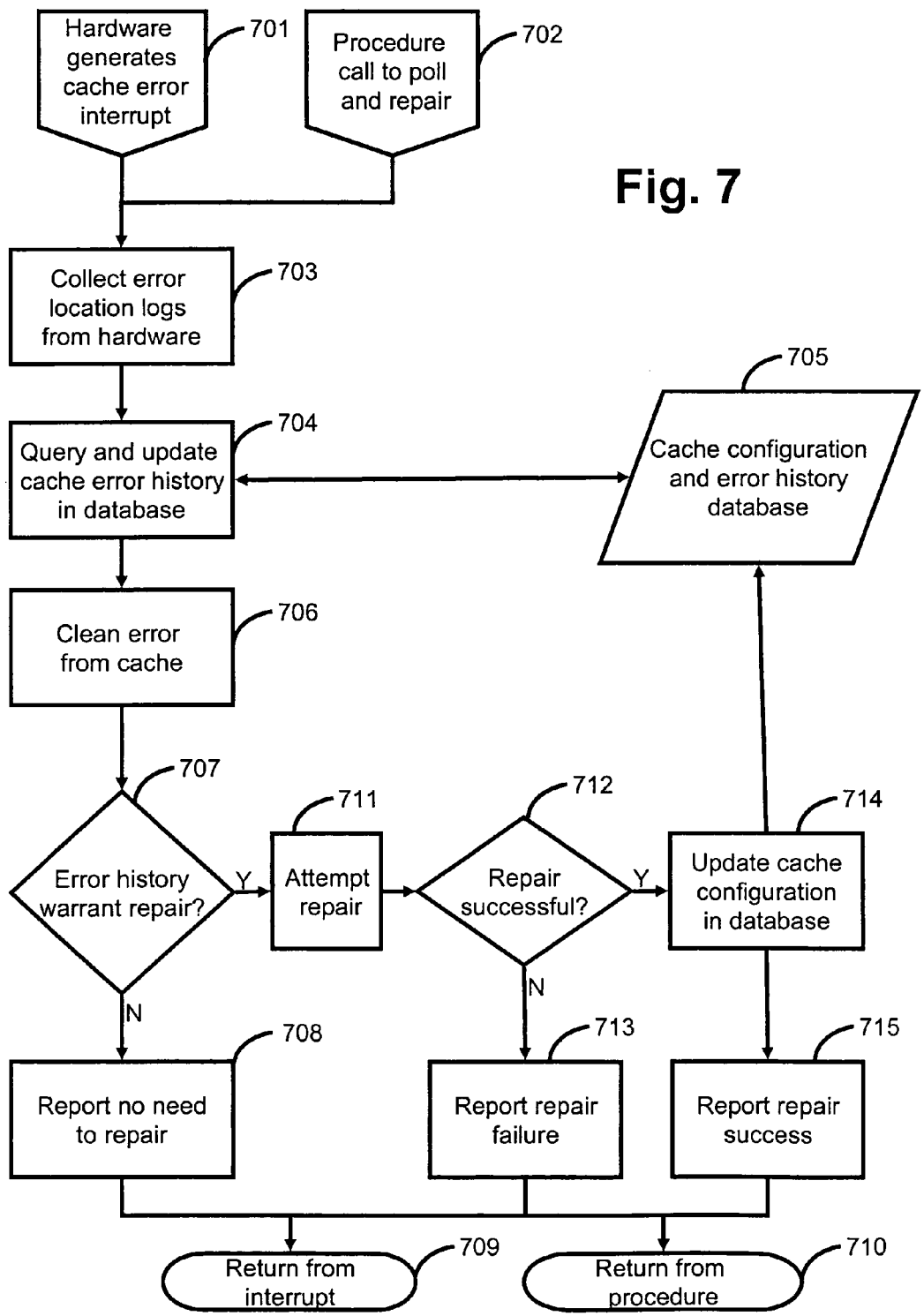
FIG. 7 is a flow chart of exemplary cache management logic of FIG. 6.

Referring to FIG. 7, exemplary cache management logic is shown which manages the cache elements without the operating system's knowledge. As shown in FIG. 7, two entry points into the cache management logic subroutine are shown. The first begins when the computer system's hardware generates a cache error interrupt, at 701. The second, similar to that described in FIG. 4, is to have the computer system 100 poll the CPU cache for cache errors, at 702. These are only two possible entry points and others are also possible.

After an error has occurred and the cache management logic has entered the subroutine, the cache management logic collects the error locations logs, at 703. The cache management logic then queries and updates the error history in the error database at step 704 based on the current error information. The error database 705 may be stored in various memory locations such as in non-volatile memory 209 or within the system's firmware. The error data that is pulled from the non-volatile memory (such as fuse data and current cache repair states) may be formatted to Built-In Self-Test "BIST" register format so that it may be stored and used in the CPU chip's BIST register. Once all of the error data and data history has been read, formatted, and inserted into the BIST register, the error is then cleaned from the cache, at step 706.

Armed with the necessary error information, the cache management logic then determines if a repair in needed at step 707. In this repair determination, the cache management logic makes sure that the cache element in question has not previously been repaired. Furthermore, the cache element logic determines whether the cache element in question has produced more than a threshold number of errors. If the cache management logic determines that the cache element is not faulty, the cache element logic reports that there is no need to repair the cache element at step 708 and either returns from the interrupt, at step 709, or returns from the polling procedure, at step 710, depending on which entry point was used to begin the repair subroutine.

If the cache element logic determines that the cache element is faulty and that a spare cache element is available, then the cache element logic attempts to repair the faulty cache element, at step 711. This is done by forcing the CPU chip having the faulty cache element hold off coherency traffic from other CPU chips. This is done by blocking snoops from other CPU chips. While the snoops are blocked and coherency traffic is being prohibited, a spare cache element is swapped in for the faulty cache element by programming the data in the BIST register accordingly.

If a spare cache element is not available or if a different problem arises during the repair process, the cache management logic determines, at step 712, that the repair was not successful and reports the repair failure at step 713. However, if a spare cache element was available and the cache management logic determines that the repair was successful, the data in the BIST register is formatted back into fuse data format and the cache configuration is updated in the database in the non-volatile memory at step 714. After the cache configuration has been updated, the cache management logic reports that the repair was successful at step 715 and returns from the interrupt or procedure.

The entire repair subroutine is performed in less time than a clock tick of the operating system. As a result, the repair may be made without the operating system's knowledge and without having to have special code or logic within the operating system to deal with the repair. This enables this procedure to be implemented on any operating system.

Figure 8:
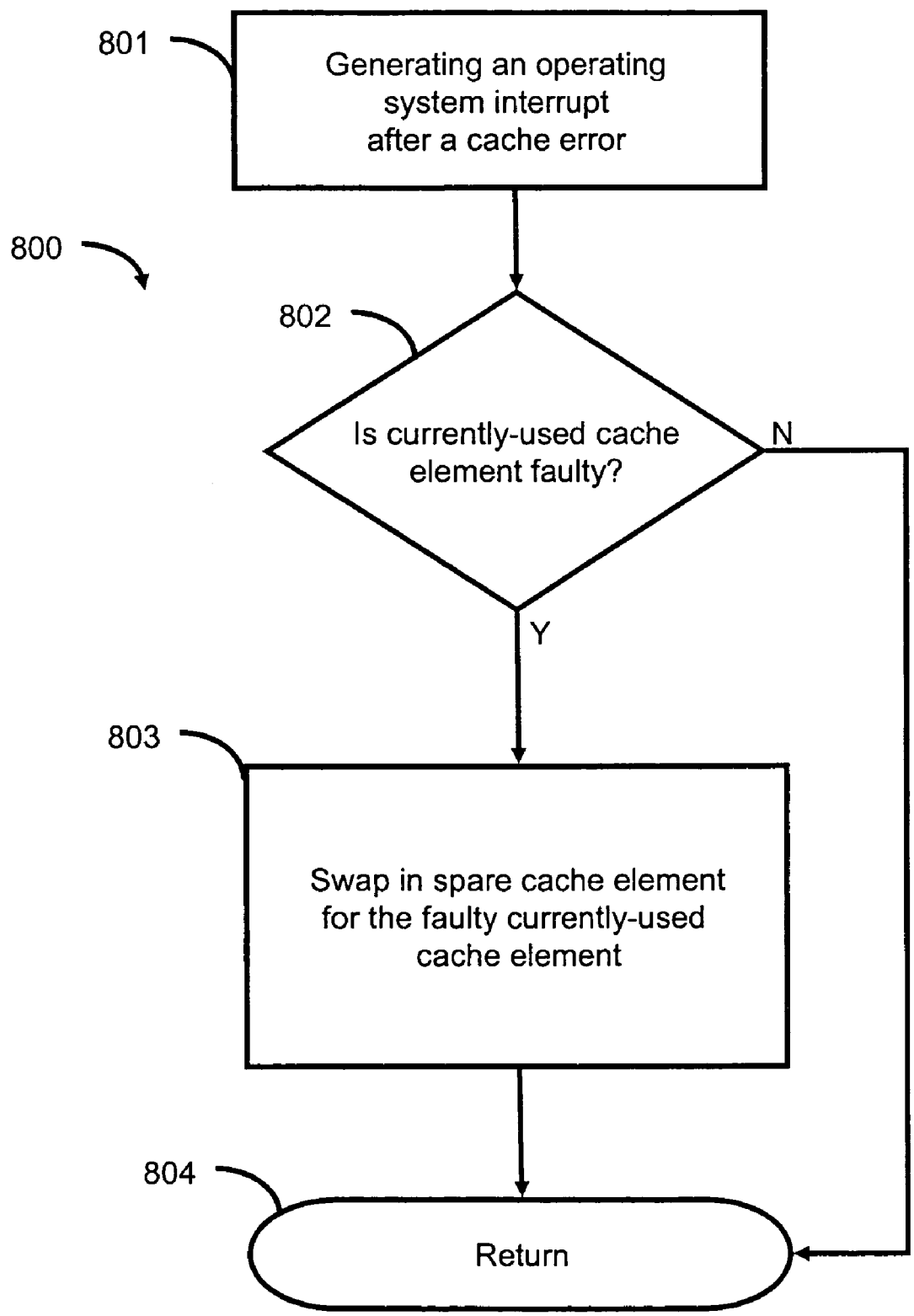
FIG. 8 is a high level flow chart of cache management logic.

Sometimes, it is desirable to generate an operating system (OS) interrupt after a cache error has occurred. This provides a safe manner in which to call the specific repair subroutine to determine if a repair is needed and to make the repair during the OS interrupt. Furthermore, since the OS is interrupted, it puts less of a burden on the actual CPU cache element repair code. FIG. 8 shows a high level flow chart and FIG. 9 shows an exemplary embodiment of a cache management logic which uses an OS handler to generate an OS interrupt and subsequently repair the faulty cache element.

Referring to FIG. 8, the cache management logic 800 generates an operating system interrupt after a cache error at step 801. If the currently-used cache element is determined to be faulty at step 802, a spare cache element is swapped in for the faulty cache element at step 803. If the currently-used cache element is not faulty (step 802) or after the faulty cache element has been repaired, the cache management logic returns to normal operation at step 804.

Figure 9:
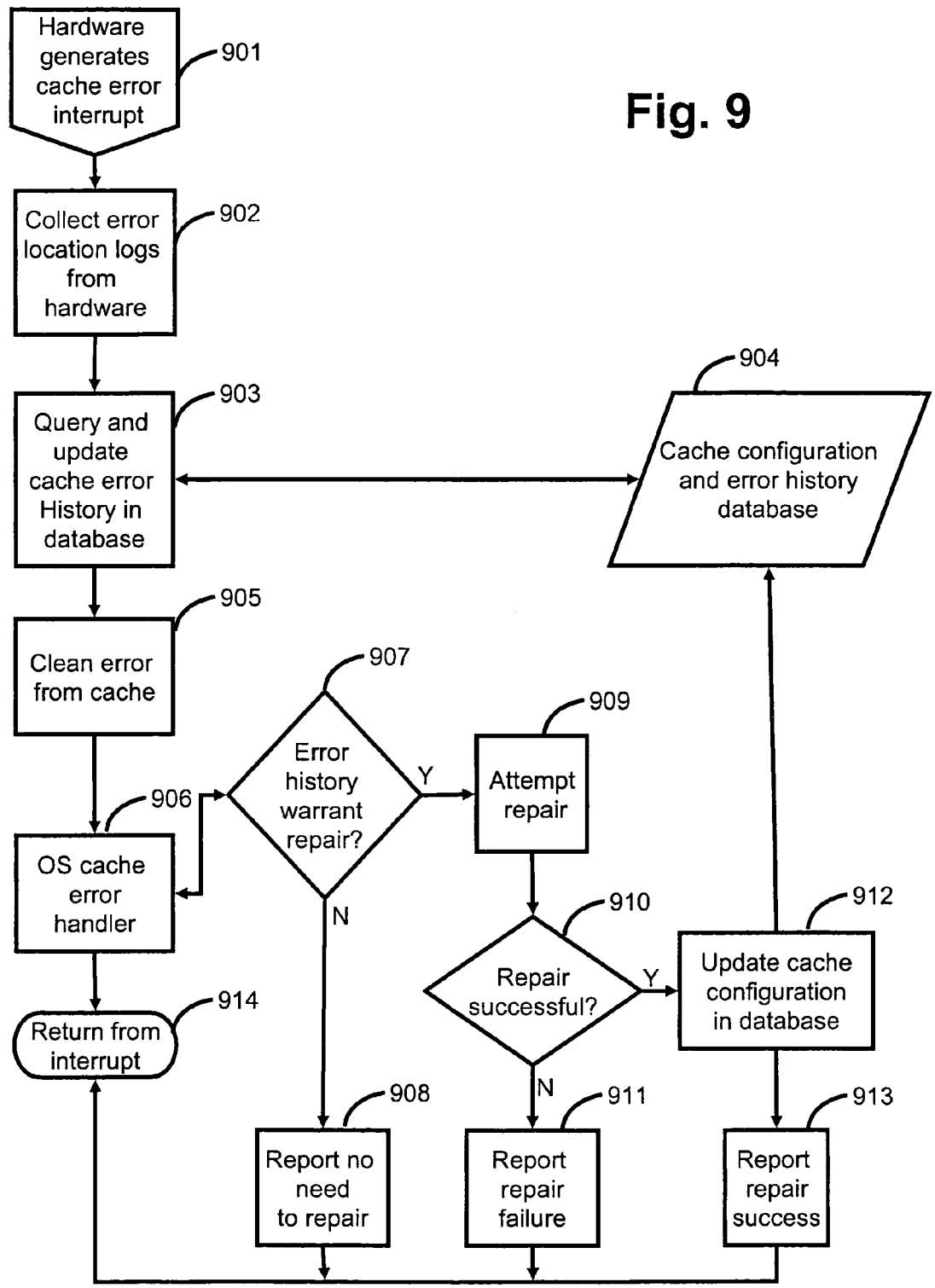
FIG. 9 is a flow chart of exemplary cache management logic of FIG. 8.

Referring to FIG. 9, an exemplary embodiment of a cache management logic which uses an OS handler to generate an OS interrupt and subsequently repair the faulty cache element is shown. The computer system hardware generates a cache error interrupt when a cache error occurs, at step 901. The cache management logic then gathers the cache error information related to the current cache error from the hardware at step 902. The cache management logic then pulls the cache configuration and error history for the non-volatile memory 904 and updates the error history with the current cache error information, at step 903. Once the cache error history has been updated with the current cache error information, the cache management logic clears the current cache error information from the cache, at step 905.

At step 906, the OS handler then generates an OS interrupt and calls for the repair process to be performed. Based on the updated cache error history, the cache management logic determines whether the cache element that produced the last error is faulty and in need of repair (step 907). If the cache element is not faulty, the cache management logic reports that a repair is not needed to the OS handler at 908. However, if the cache element is faulty, the cache management logic attempts to repair the faulty cache element, at step 909.

The cache management logic determines if the repair was successful (i.e. a spare cache element was available and properly swapped in for the faulty cache element), at step 910. If the repair was not successful, the cache management logic reports such to the OS handler at step 911. However, if the repair was successful, the cache configuration is updated in the database, at step 912, and the successful repair is reported to the OS handler, at step 913. Subsequently, cache management logic returns from the cache error interrupt, at 914.

By using an OS handler to generate an OS interrupt before attempting to repair a possible faulty cache element, a safer and more elaborate repair analysis/procedure can be performed.

Figure 10A:
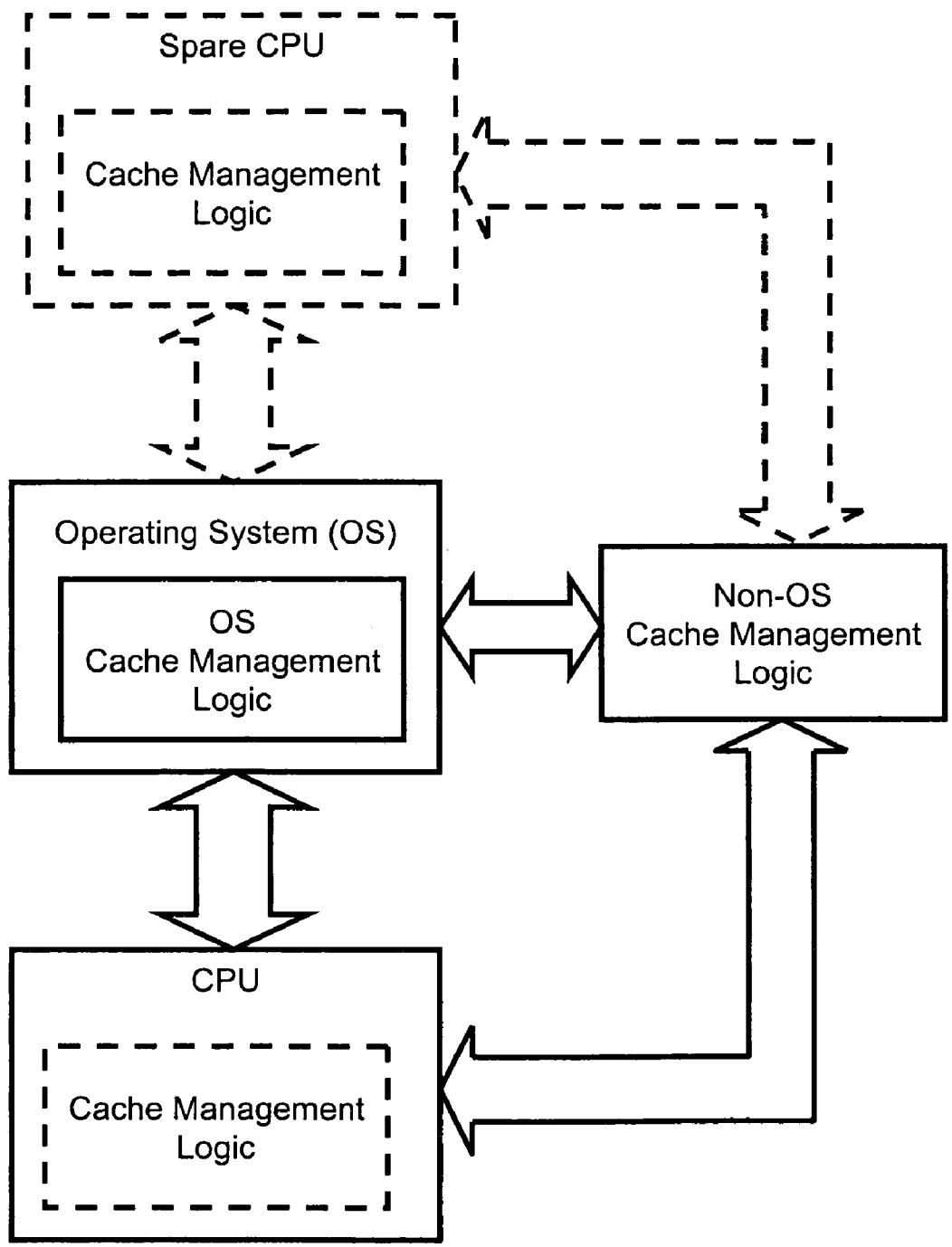
FIGS. 10A and 10B illustrate cache management logic having operating system (OS) and non-operating system (Non-OS) components.
Figure 10B:
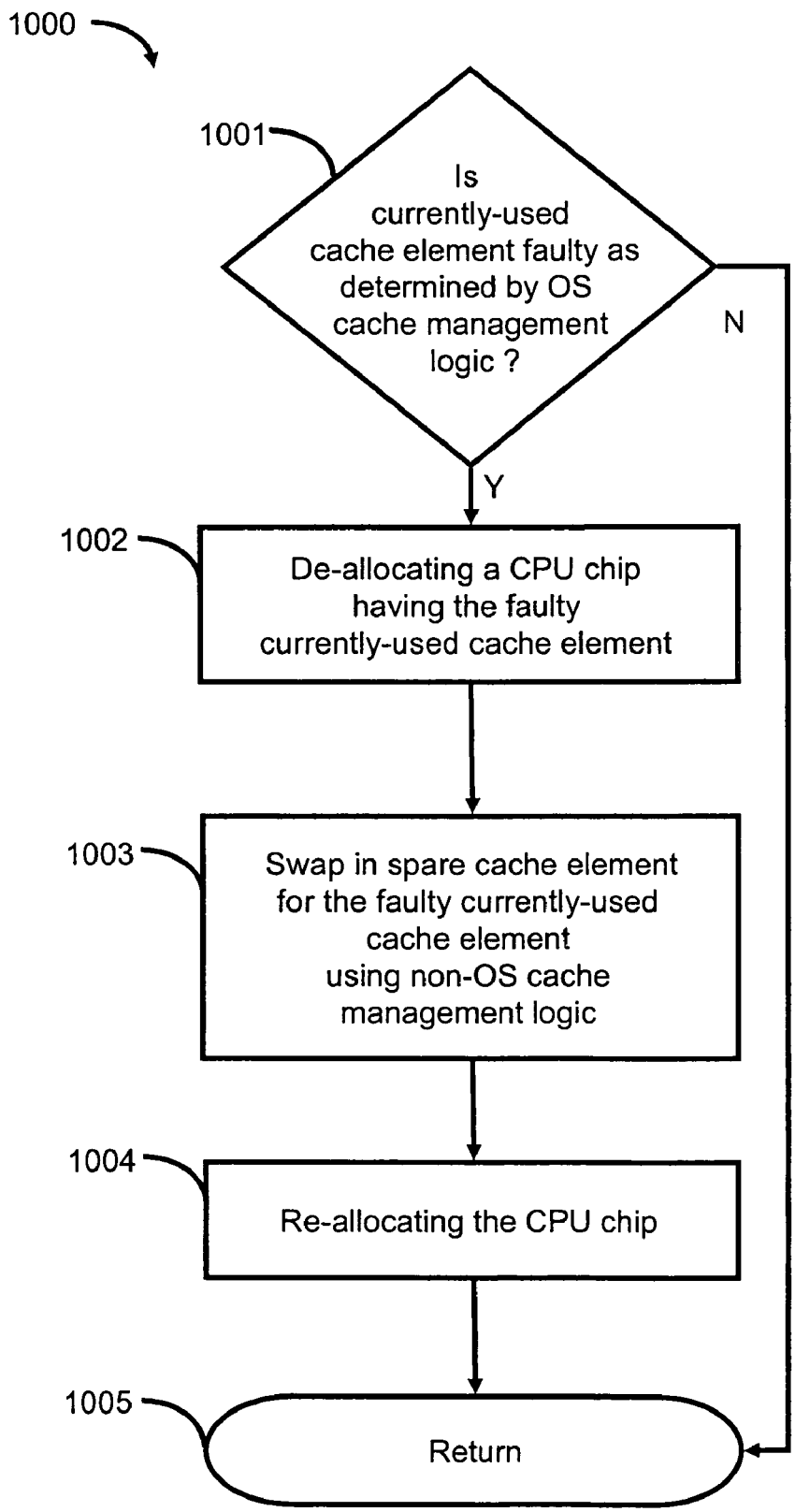
Figure 11:
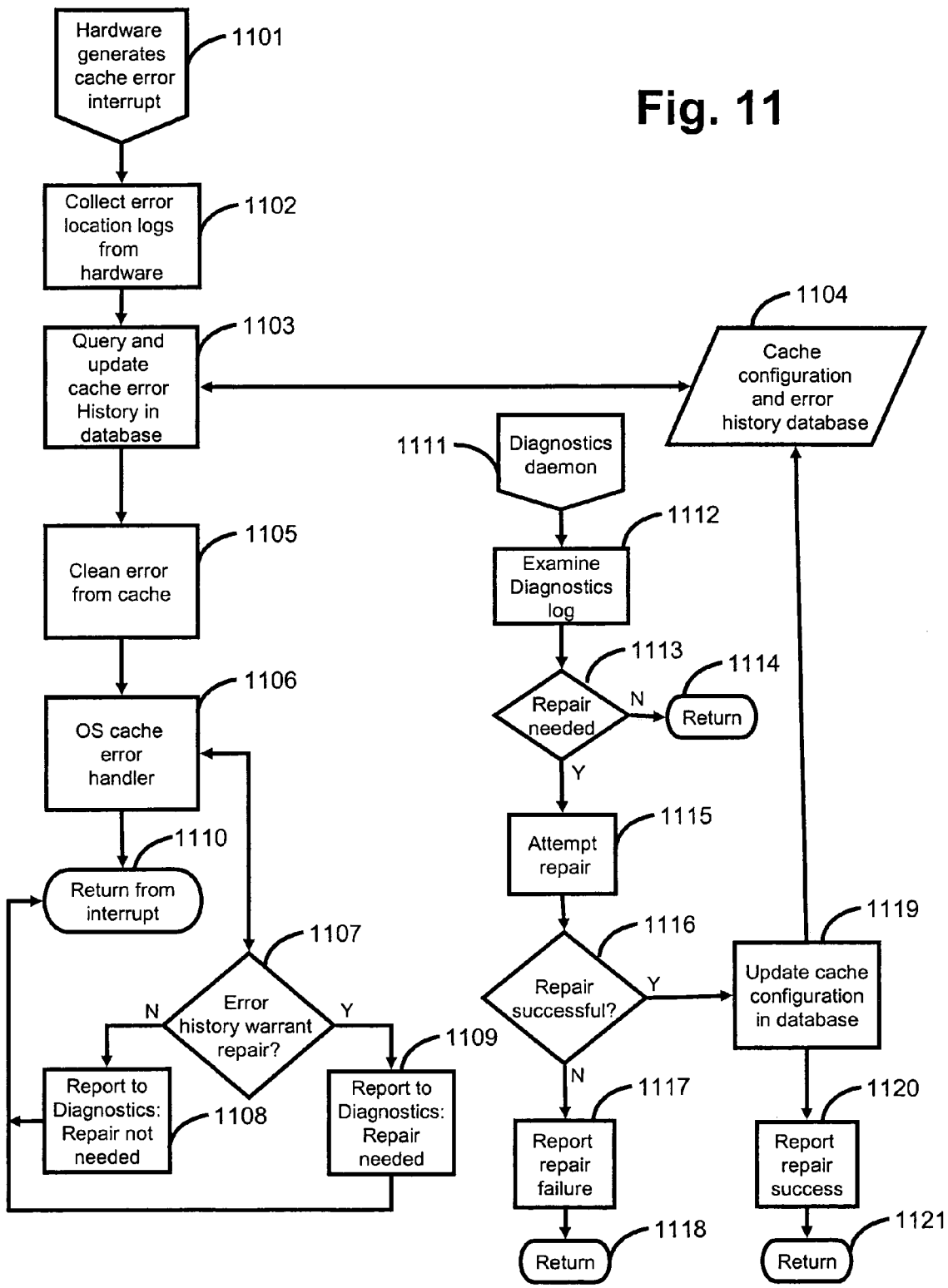
FIG. 11 is a flow chart of exemplary cache management logic of FIGS. 10A and 10B.

The safest way to perform a cache element repair is for the operating system (OS) itself to determine when a cache element is in need of repair. The OS can then safely remove or de-allocate the CPU that has the faulty cache element from the available pool of CPU resources and call for a different program to actually perform the cache element repair process on the de-allocated CPU cache. This gives the repair process virtually unrestricted time and freedom to perform extensive repair processes if needed without the fear of creating problems for the remaining applications running on the OS. FIGS. 10A, 10B and 11 show one embodiment of cache management logic within the OS code itself (OS cache management logic) to determine if a repair is needed and to call a non-OS application (non-OS cache management logic) to repair the cache.

Referring to FIG. 10B, the cache management logic 1000 determines if a currently-used cache element is faulty using OS cache management logic, at step 1001. If the OS management logic determines that the currently-used cache element is faulty, the CPU having the faulty currently-used cache element is de-allocated at step 1002. A spare cache element is then swapped in, as described above, for the faulty currently-used cache element using non-OS cache management logic at step 1003. Subsequently, the CPU chip is then re-allocated to the pool of available system resources at step 1004. However, if the currently-used cache element is not faulty (step 1001) or following re-allocation of a repaired CPU (step 1004), the cache management logic and computer system 100 is returned to normal operation at step 1005.

Referring to FIG. 11, one embodiment of cache management logic within the OS code itself (OS cache management logic) to determine if a repair is needed and to call a non-OS application (non-OS cache management logic) to repair the cache is shown. The computer system hardware generates a cache error interrupt when a cache error occurs at step 1101. The cache management logic then gathers the cache error information related to the current cache error from the hardware or firmware at step 1102. The cache management logic then reads the cache configuration and error history for the non-volatile memory 1104 and updates the error history with the current cache error information at step 1103. Once the cache error history has been updated with the current cache error information, the cache management logic clears the current cache error information from the cache at step 1105.

At step 1106, an OS cache error handler (part of the OS cache management logic) generates an OS interrupt. Subsequently, the OS cache management logic determines at step 1107 whether the error history warrants repairing the particular cache element that produced the most recent error. If the cache element does not need to be repaired then, at step 1108, the OS cache management logic reports to a diagnostics program (part of the non-OS cache management logic) that repair is not needed. However, if the cache element is deeded to be faulty then, at step 1109, the OS cache management logic reports to the diagnostics program that the cache element will need to be repaired and de-allocates the CPU containing the faulty cache element. After the OS cache management logic reports to the diagnostics program, the system returns from the cache error interrupt at step 1110.

If the cache element is faulty, the diagnostics program intervenes at step 1111 to begin the repair process. At step 1112, the diagnostics program examines the log of cache error information that includes the cache error history and current cache configuration. Diagnostics then confirms at step 1113 that the cache element is actually faulty and is in need of repair. If the cache element is not faulty, the diagnostic program simply returns without attempting a repair (step 1114) and the CPU is re-allocated within the computer system 100. While this may be redundant, often it is desirable to have the initial determination of whether a cache element is faulty be done by the OS cache management logic using a simple test followed by a more thorough test performed by a diagnostic or other non-OS cache management logic while the CPU has been de-allocated. The simple test performed by the OS cache management logic can quickly identify problematic cache elements while the non-OS cache management logic has more time and resources to properly test/analyze the cache element since the CPU is de-allocated. If desired, the second determination, step 1113, may be eliminated. If the diagnostic program confirms that the cache element is in need of repair, then it attempts to repair the faulty cache element at step 1115.

The diagnostics program determines if the repair was successful (i.e., a spare cache element was available and properly swapped in for the faulty cache element) at step 1116. If the repair was not successful, the cache management logic reports such to the computer system 100 at step 1117 and returns from the cache error interrupt at step 1118. The diagnostics program may also try to swap in a spare CPU chip for the CPU chip which has the faulty (and unrepairable) cache element. However, if the repair was successful, the cache configuration is updated in the database at step 1119 and the successful repair is reported to the computer system 100 at step 1120. Subsequently, cache management logic returns from the cache error interrupt at 1121.

While the present invention has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. For example, the number of spare cache elements, spare CPUs, and the definition of a faulty cache or memory can be changed. Therefore, the inventive concept, in its broader aspects, is not limited to the specific details, the representative apparatus, and illustrative examples shown and described. Accordingly, departures may be made from such details without departing from the spirit or scope of the applicant's general inventive concept.

What is claimed is:

1. A method for repairing a processor comprising the steps of:
    initializing and executing an operating system;
    determining that an allocated cache element is faulty; and
    swapping in a spare cache element for said faulty allocated cache element while the operating system is executing, wherein said method is performed within a predetermined number of clock ticks of said operating system.

2. The method of claim 1 wherein said predetermined number of clock ticks is one clock tick of said operating system.

3. The method of claim 1 wherein said predetermined number of clock ticks is two or more clock ticks of said operating system.

4. The method of claim 1, further comprising the steps of:
    monitoring for a cache error while said operating system is executing; and
    gathering and recording cache error information.

5. The method of claim 1, further comprising the step of:
    determining whether said spare cache element is available if said allocated cache element is determined to be faulty.

6. The method of claim 5, further comprising the step of:
    de-allocating said processor if said spare cache element is not available.

7. The method of claim 6, further comprising the step of:
    swapping in a spare processor for said de-allocated processor.

8. The method of claim 1, further comprising the step of:
    reporting actions taken and updating cache configuration on a memory device.

9. A CPU cache element management system comprising:
    at least one CPU having at least one allocated cache element and at least one non-allocated cache element; and
    cache management logic operable to determine whether allocated cache elements are faulty and operable to swap in said non-allocated cache elements for said faulty allocated cache elements within a predetermined number of clock ticks of an executing operating system.

10. The CPU cache element management system of claim 9, wherein said predetermined number of clock ticks is one clock tick of said executing operating system.

11. The CPU cache element management system of claim 9, wherein said predetermined number of clock ticks is two or more clock ticks of said executing operating system.

12. The CPU cache element management system of claim 9, wherein said cache management logic is further operable to monitor cache errors and record cache error information in a memory.

13. The CPU cache element management system of claim 12, wherein said cache error information is stored in a non-volatile memory.

14. The CPU cache management system of claim 9, wherein said cache management logic is further operable to determine whether at least one non-allocated cache element is available if said allocated cache element is determined to be faulty.

15. The CPU cache management system of claim 14, wherein said cache management logic is further operable to de-allocate said CPU if said at least one non-allocated cache element is not available.

16. The CPU cache management system of claim 15, wherein said cache management logic is further operable to swap in a spare CPU for said de-allocated CPU.

17. The CPU cache management system of claim 9, wherein said cache management logic is further operable to report cache management actions taken and update a cache configuration stored on a memory device.

18. A computer system comprising:
    at least one CPU having at least one allocated cache element and at least one spare cache element; and
    cache management logic operable to determine whether said at least one allocated cache element is faulty and operable to swap in said at least one spare cache element for said faulty allocated cache element within a predetermined number of clock ticks of an executing operating system.

19. The computer system of claim 18, wherein said predetermined number of clock ticks is one clock tick of said executing operating system.

20. The computer system of claim 18, wherein said predetermined number of clock ticks is two or more clock ticks of said executing operating system.

21. The computer system of claim 18, wherein said cache management logic is further operable to monitor cache errors and record cache error information in a memory.

22. The computer system of claim 21, wherein said cache error information is stored in a non-volatile memory.

23. The computer system of claim 18, wherein said cache management logic is further operable to determine whether said at least one spare cache element is available if said allocated cache element is faulty.

24. The computer system of claim 23, wherein said cache management logic is further operable to de-allocate said CPU if said at least one spare cache element is not available.

25. The computer system of claim 24, wherein said cache management logic is further operable to swap in a spare CPU for said de-allocated CPU.

26. The computer system of claim 18, wherein said cache management logic is further operable to report cache management actions taken and update a cache configuration on a memory device.

27. A method for repairing a computer system having an executing operating system comprising the steps of:
    monitoring at least one cache element associated with at least one CPU for at least one cache error;
    recording cache error information associated with said at least one cache error;
    determining whether said at least one cache element is faulty based on said cache error information;
    determining if at least one spare cache element is available if said at least one cache element is faulty; and
    swapping in said at least one spare cache element if said at least one spare cache element is available and said at least one cache element is faulty within a predetermined number of clock ticks of the executing operating system.

28. The method of claim 27 wherein said predetermined number of clock ticks is one clock tick of said operating system.

29. The method of claim 27 wherein said predetermined number of clock ticks is two or more clock ticks of said operating system.

30. The method of claim 27, wherein said at least one cache element is determined to be faulty if a total number of errors occurring from said at least one cache element exceeds a predetermined threshold.

31. The method of claim 30, wherein said predetermined threshold is based on a total number of errors occurring from said cache element over a predetermined time period.

32. The method of claim 27 further comprising the step of:
de-allocating said at least one CPU if said at least one spare cache element is not available.

33. The method of claim 32 further comprising the steps of:
determining whether a spare CPU is available; and
swapping in said spare CPU for said de-allocated CPU if said spare CPU is available.

34. The method of claim 27 further comprising the step of:
updating a cache configuration in a memory.

35. A processor comprising:
a plurality of first memory portions;
a plurality of second memory portions;
logic for determining whether a first memory portion is faulty; and
logic for replacing the faulty first memory portion with a second memory portion within a predetermined number of clock ticks of an executing operating system.

36. The processor of claim 35, wherein said predetermined number of clock ticks is one clock tick of said executing operating system.

37. The processor of claim 35, wherein said predetermined number of clock ticks is two or more clock ticks of said executing operating system.

38. The processor of claim 35 wherein the logic for determining whether a first memory portion is faulty comprises logic for monitoring errors associated the first memory portion.

39. The processor of claim 35 wherein the logic for determining whether a first memory portion is faulty comprises logic for comparing a number of errors associated with the first memory portion to a threshold value.

40. The processor of claim 35 wherein the logic for replacing the faulty first memory portion with a second memory portion comprises logic for determining if a second memory portion is available for use in the replacement.

41. The processor of claim 35 wherein the logic for replacing the faulty first memory portion with a second memory portion comprises logic for de-allocating the processor if a second memory portion is not available for use in the replacement.

42. A method for repairing a faulty cache element associated with a processor comprising the steps of:
reading cache configuration data from a non-volatile memory;
formatting said cache configuration data into BIST register format;
storing said cache configuration data in a BIST register;
blocking snoops to said processor;
modifying said cache configuration data in said BIST register to swap in a de-allocated cache element for said faulty cache element; and
re-formatting said cache configuration data and storing said cache configuration data in said non-volatile memory.

43. A processor comprising:
a first cache means configured for high-speed information storage and retrieval from the processor;
a second cache means for high-speed information storage and retrieval;
means for determining whether any portion of the first cache means configured for high-speed information storage is faulty; and
means for replacing the faulty portion of the first cache means with at least a portion of the second cache means for high-speed information storage and retrieval within a predetermined number of clock ticks of an executing operating system.

44. The processor of claim 43, wherein said predetermined number of clock ticks is one clock tick of said executing operating system.

45. The processor of claim 43, wherein said predetermined number of clock ticks is two or more clock ticks of said executing operating system.

46. The processor of claim 43 wherein the means for determining comprises means for monitoring errors associated the first cache means.

47. The processor of claim 43 wherein the means for determining comprises means for comparing a number of errors associated with the first cache means to a threshold value.

48. The processor of claim 43 wherein the means for replacing comprises means for determining if any portion of the second cache means is available for use in the replacement.

49. The processor of claim 43 wherein the means for replacing comprises means for de-allocating the processor if no portion of the second cache means is available for use in the replacement.

* * * * *